United States Patent
Sorensen et al.

[11] Patent Number: 5,977,519
[45] Date of Patent: Nov. 2, 1999

[54] HEATING ELEMENT WITH A DIAMOND SEALING MATERIAL

[75] Inventors: Carl A. Sorensen, Morgan Hill; Daniel Winkler, Byron, both of Calif.

[73] Assignee: Applied Komatsu Technology, Inc., Tokyo, Japan

[21] Appl. No.: 08/807,439

[22] Filed: Feb. 28, 1997

[51] Int. Cl.⁶ .............................. H05B 3/44; H05B 3/48; H05B 3/18; H01C 1/03

[52] U.S. Cl. ...................... 219/402; 219/390; 219/544; 219/553; 118/728; 338/238

[58] Field of Search .................... 219/390, 405, 219/411, 402, 538, 541, 542, 544, 546, 548, 552, 553; 118/724, 725, 728, 50.1; 174/118; 338/238

[56] References Cited

U.S. PATENT DOCUMENTS

| | | | |
|---|---|---|---|
| 3,477,058 | 11/1969 | Vedder et al. | 338/238 |
| 3,571,477 | 3/1971 | Phillips | 338/238 |
| 3,621,204 | 11/1971 | Neidhardt et al. | 219/553 |
| 4,034,330 | 7/1977 | Goto | 338/238 |
| 4,087,777 | 5/1978 | Clasen et al. | 338/238 |
| 4,101,760 | 7/1978 | Roller | 219/544 |
| 4,129,774 | 12/1978 | Inano et al. | 219/552 |
| 4,234,786 | 11/1980 | Borom et al. | 219/544 |
| 4,280,932 | 7/1981 | Borom et al. | 338/238 |
| 4,326,122 | 4/1982 | McCulloch et al. | 219/544 |
| 4,435,693 | 3/1984 | Johnson | 338/238 |
| 4,800,002 | 1/1989 | Peters | 204/15 |
| 5,488,350 | 1/1996 | Aslam et al. | 219/541 |
| 5,695,568 | 12/1997 | Sinha et al. | 118/728 |

FOREIGN PATENT DOCUMENTS

| | | |
|---|---|---|
| 0 658 066 A2 | 6/1995 | European Pat. Off. . |
| 63-026371 | 2/1988 | Japan . |
| 3-25880 | 2/1991 | Japan . |
| 05094865 | 4/1993 | Japan . |
| 6-348153 | 12/1994 | Japan . |
| 629 693 | 5/1982 | Switzerland . |

*Primary Examiner*—Jospeh Pelham
*Attorney, Agent, or Firm*—Fish & Richardson

[57] ABSTRACT

A substrate support plate including a heating element for use in a process chamber is described. The heating element includes an outer sheath, a heating filament and a thermally-conductive and electrically insulative sealing material. The sealing material comprises a diamond powder.

5 Claims, 3 Drawing Sheets

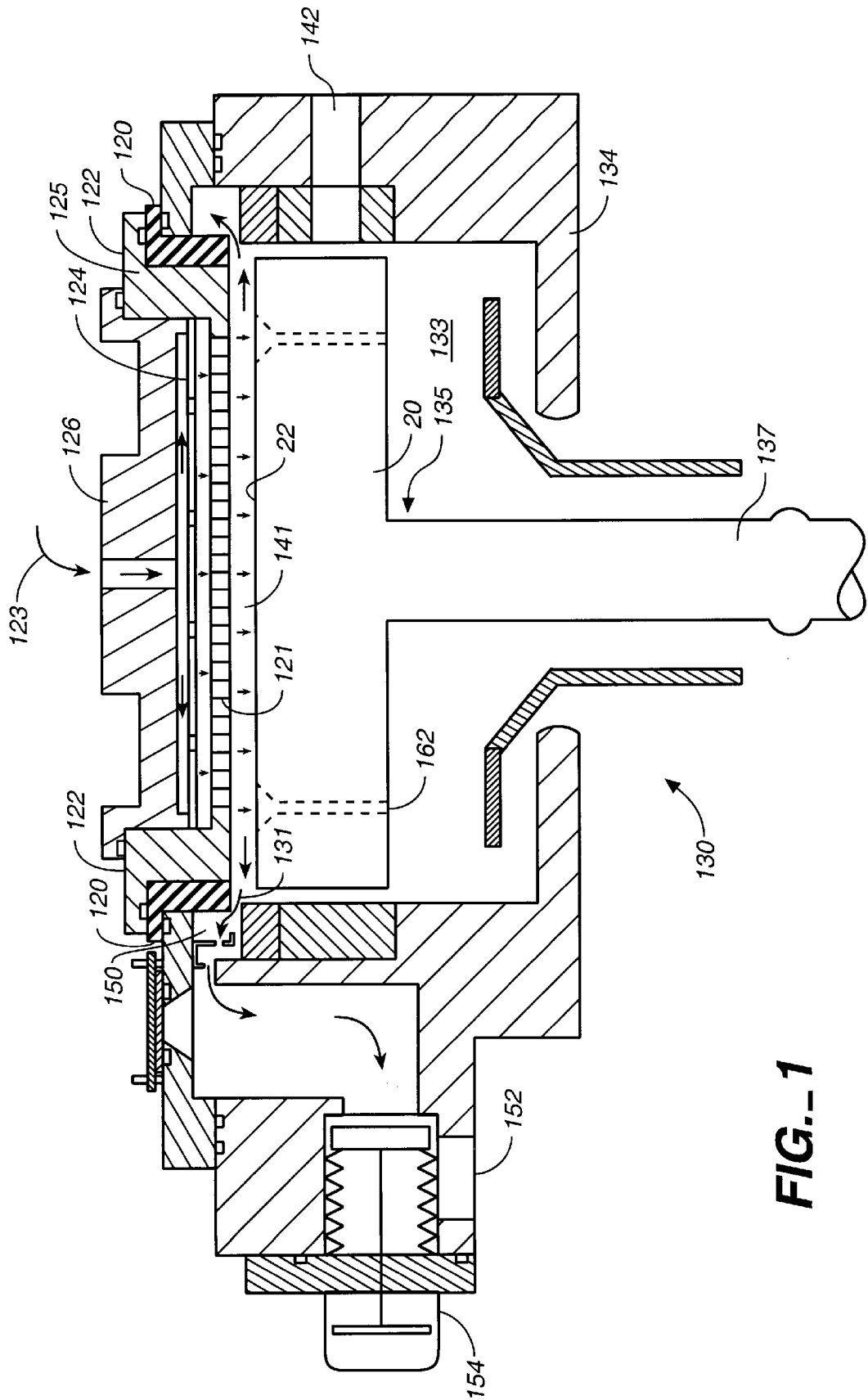
FIG._1

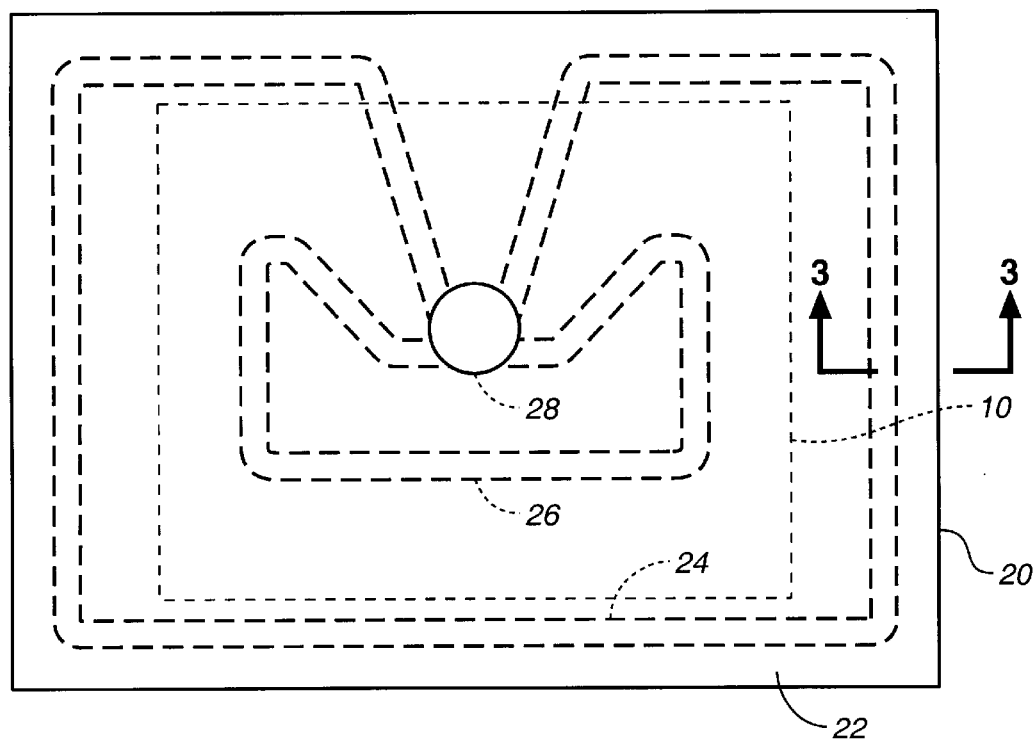
FIG._2
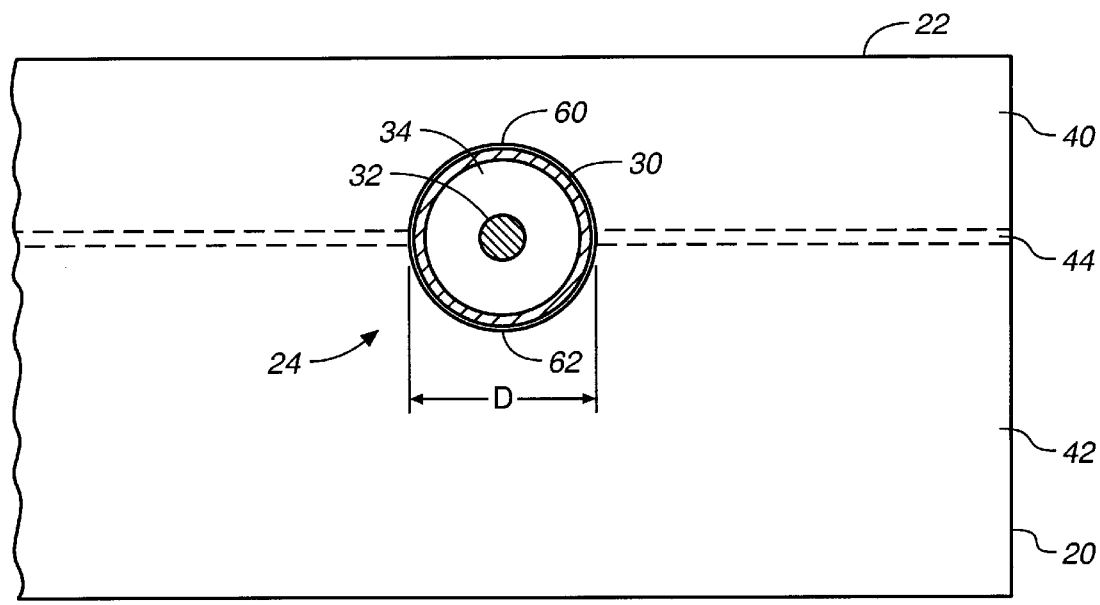
FIG._3

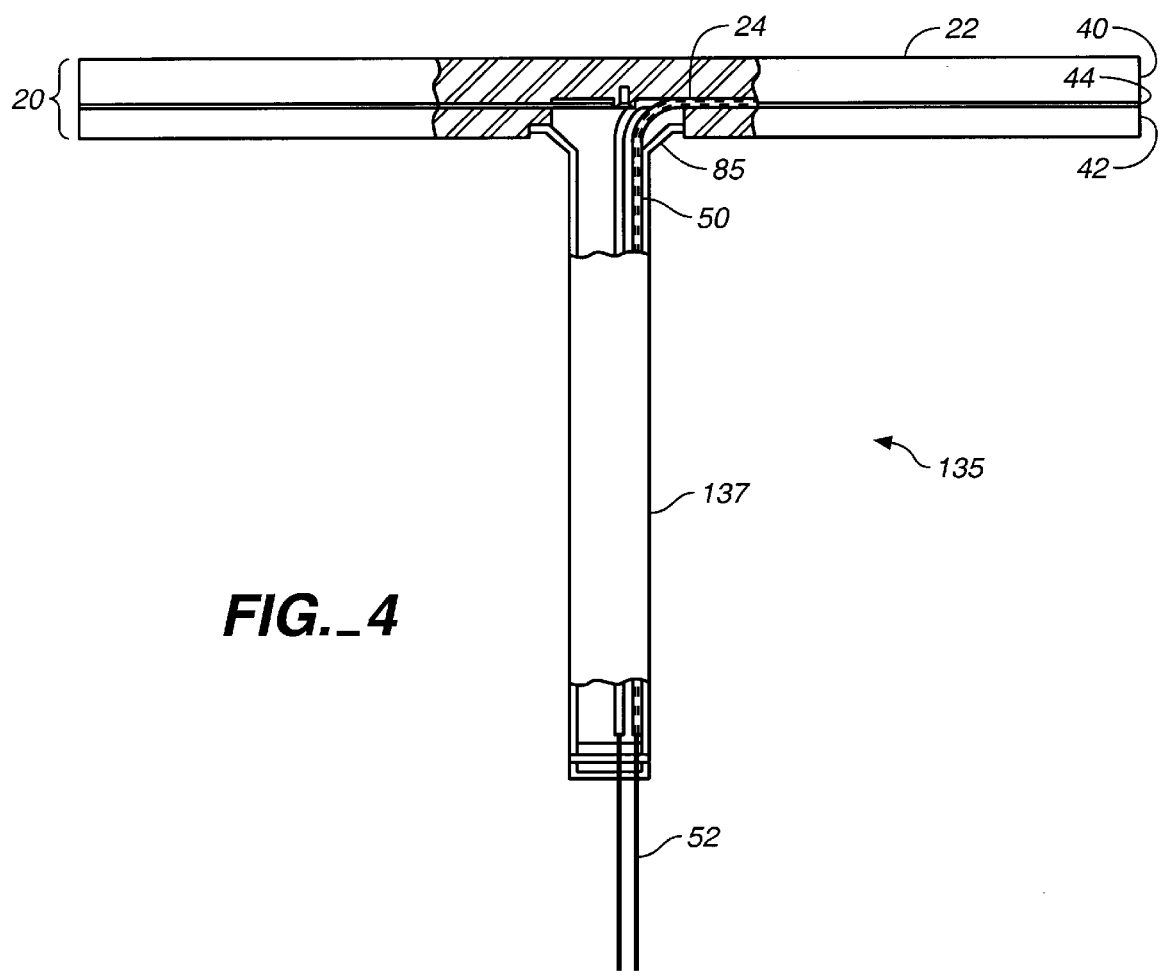
FIG._4
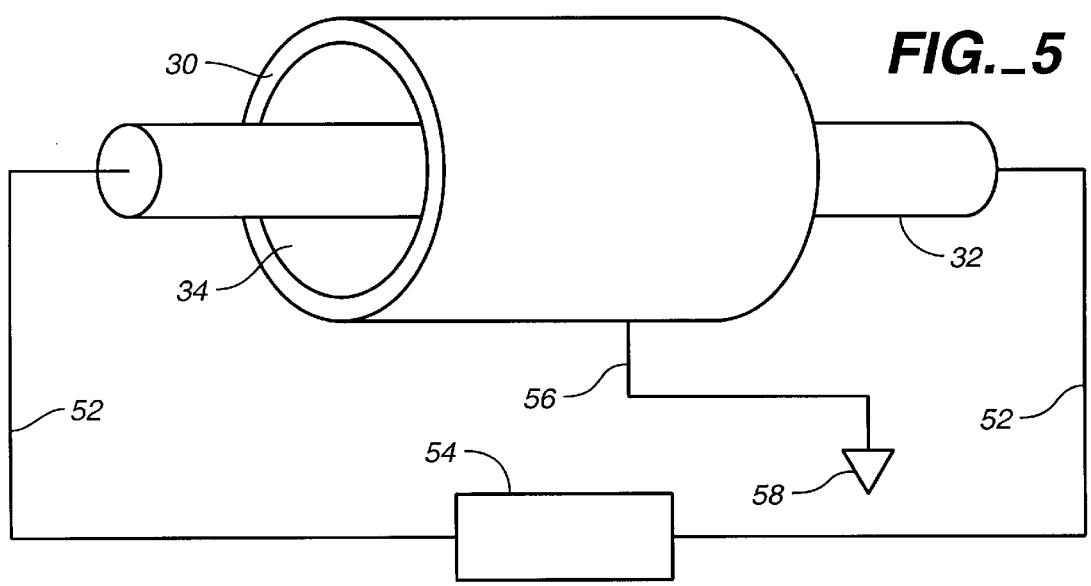
FIG._5

HEATING ELEMENT WITH A DIAMOND SEALING MATERIAL

BACKGROUND OF THE INVENTION

The present invention relates generally to a heating element, and more particularly to a heating element disposed in a support plate for heating a substrate in a processing chamber.

A susceptor is a mechanical part that holds a substrate in a processing chamber for a fabrication step, such as chemical vapor deposition (CVD). The susceptor includes a substrate support plate mounted on a stem, along with a lift assembly for raising and lowering the substrate within the processing chamber. The substrate support plate is heated to facilitate the fabrication process. Typically, a heating element is disposed within the support plate. The heating element maybe a tube assembly which includes a heating filament surrounded by an outer sheath. The space between the heating filament and the outer sheath may be filled by a sealing material.

Heat density refers to the amount of heat which is generated by a heating element over a given length of the element. Power density is a related concept which refers to the amount of power (in watts) which is dissipated over a given length of the element. Heating elements having high heat and power densities are preferable in substrate fabrication processes to minimize the area of the support plate occupied by the heating element, while still enabling adequate heating of a substrate.

To achieve high heat and power density performance for the heating element, the sealing material should efficiently transfer heat from the filament to the outer sheath; that is, the sealing material should be thermally conductive. However, the sealing material should also be electrically insulative to prevent a short circuit between the heating filament and outer sheath. The outer sheath of the heating element may be constructed of a metal such incoloy, which is an alloy primarily composed of iron, nickel and chromium manufactured by The International Nickel Co., Inc. The sealing material may be magnesium oxide (MgO) or boron nitride (BN).

The susceptor plate undergoes heating and cooling each time a substrate is processed in the chamber. This repeated heating and cooling subjects the sealing material to considerable thermal stresses. The shock of repeated thermal stresses may reduce the thermal conductivity or increase the electrical conductivity of the sealing material. If the thermal conductivity of the sealing material decreases, heat will accumulate in the filament. As a result, the filament may burnout or the susceptor may be not adequately heated. If the electrical conductivity of the sealing material increases, then there may be a short circuit between the filament and the outer sheath. Thus, the sealing material should be resistant to thermal shock so that the heating element has a long lifetime.

SUMMARY OF THE INVENTION

In general, in one aspect, the invention is directed to a heating element. The heating element has a heating filament, a sheath surrounding the heating filament, and a sealing material disposed inside the sheath to conduct heat from the filament to the sheath. The sealing material contains a diamond powder.

Implementations of the invention may include the following. The sealing material may also include a filler material, such as magnesium oxide or boron nitride. The diamond powder may have a particle size of about five to fifty microns or fifteen to thirty microns. The diamond powder may have a particle size selected to provide the sealing material with a thermal conductivity of several hundred watts per meter per degree Kelvin and an electrical resistivity of about $10^{16}$. The diamond powder may have a particle size selected to provide the sealing material with a thermal conductivity and an electrical resistivity greater than those of a ceramic material. The sheath may be electrically conductive.

In general, in another aspect, the invention is directed to a substrate support structure for use in a processing chamber. The substrate support structure includes a plate having a top surface for supporting a substrate, and a heating element in the plate. The sealing material in the heating element contains a diamond powder.

Among the advantages of the invention are the following. A substrate support plate is provided with a heating element having a long lifetime. The heating element includes a sealing material which is which is thermally conductive, electrically insulative, resistant to thermal shock, and chemically inert. The heating element assures proper heat dissipation for high heat and power density applications. The particle size of the diamond powder may be selected to provide desired thermal and electrical properties.

Additional advantages of the invention will be set forth in the description which follows and in part will be obvious from the description, or may be learned by practice of the invention. The advantages of the invention may be realized and obtained by means of the instrumentalities and combinations particularly pointed out in the claims.

BRIEF DESCRIPTION OF THE DRAWINGS

The accompanying drawings, which are incorporated and constitute a part of the specification, schematically illustrate the invention and, together with the general description given above and the detailed description given below, serve to explain the principles of the invention.

FIG. 1 is a cross-sectional view of a CVD processing chamber.

FIG. 2 is a top view of a substrate support plate according to the present invention.

FIG. 3 is a cross-sectional view along line 3—3 of FIG. 2.

FIG. 4 is a cross-sectional view of a susceptor used in the CVD processing chamber of FIG. 1.

FIG. 5 shows the electrical connections to a heating element used in the substrate support plate of FIG. 4.

DESCRIPTION OF THE PREFERRED EMBODIMENT

The present invention is directed to an improved heating element for use in a substrate support plate. In the implementation described below, the support plate is used in a CVD chamber. However, the invention is also applicable to other sorts of processing chambers. For example, the invention may be used in chambers which carry out rapid thermal processing or physical vapor deposition. Many of the details described are specific to the implementation described and may be changed as known by those skilled in the art.

CVD is a process to deposit a thin film layer onto a substrate. The term "substrate" broadly covers any object that is being processed in a process chamber. The term "substrate" includes, for example, semiconductor wafers, flat panel displays, glass plates or disks, and plastic workpieces.

In general, the substrate is supported in a vacuum deposition process chamber, and the substrate is heated to several hundred degrees Centigrade. Deposition gases are injected into the chamber, and a chemical reaction occurs to deposit a thin film layer onto the substrate. The thin film layer may be a dielectric layer (such as silicon nitride or silicon oxide), a semiconductor layer (such as amorphous silicon) or a metal layer (such as tungsten). The deposition process may be plasma enhanced or thermally enhanced.

As shown in FIG. 1, a CVD apparatus 130 includes a susceptor 135 having a substrate support plate 20 mounted on a stem 137. The susceptor 135 is positioned within a vacuum deposition process chamber 133. An upper face 22 of the support plate 20 supports a substrate, such as a glass panel or semiconductor wafer (not shown), in a substrate processing or reaction region 141. A lift mechanism (not shown) is provided to raise and lower the susceptor 135. Lift pins (not shown) may pass through lift pin holes 162 in the support plate 20 to facilitate the transfer of substrates into and out of the chamber 133 through an opening 142 in a sidewall 134 of the chamber 133 by a robot blade (not shown).

Deposition process gases (indicated by arrow 123) flow into the chamber 133 through an inlet manifold 126. The gases then flow through a perforated blocker plate 124 and holes 121 in a process gas distribution faceplate 122 (indicated by small arrows in the substrate processing region 141 of FIG. 1). The upper face 22 of the support plate 20 is parallel and spaced-closely to the faceplate 122. A radio frequency (RF) power supply (not shown) may be used to apply electrical power between the gas distribution faceplate 122 and the susceptor 135 so as to excite the process gas mixture to form a plasma. The constituents of the plasma react to deposit a desired film on the surface of the substrate on the support plate 20.

The deposition process gases may be exhausted from the chamber through a slot-shaped orifice 131 surrounding the reaction region 141 into an exhaust plenum 150. From exhaust plenum 150, the gases flow by a vacuum shut-off valve 152 and into an exhaust outlet 154 which connects to an external vacuum pump (not shown).

Referring to FIG. 2, a top view of the substrate support plate 20 is shown. As noted, the support plate 20 includes an upper face 22 for supporting a substrate 10 (shown in phantom) in the vacuum deposition process chamber. The support plate 20 may be a rectangular shaped body fabricated of high purity 100.1 grade, unanodized, cast aluminum. An outer heating element 24 and an inner heating element 26 (both shown in phantom) are disposed beneath the surface 22 of the support plate 20. For ease of understanding, the heating elements are shown in FIG. 2 even though they are located beneath the top surface 22 and would not be visible.

The heating elements 24 and 26 may provide dual and generally parallel loops. This dual loop pattern provides for a generally radially-symmetric temperature distribution across the support plate 20, while allowing for greater heat losses at its outside surfaces. Other heating element configurations, of course, are possible.

Heating elements 24 and 26 are identical in construction, and only differ in length and positioning in the support plate 20. Accordingly, a description of the structure of only one heating element is provided.

Referring to FIG. 3, the heating element 24 includes an electrically-conductive outer sheath 30, a heating filament 32 and an electrically-insulative and thermally-conductive sealing material 34 disposed therebetween. In operation, the sealing material 34 prevents the burn-out or short-circuiting of the heating filament 32 by providing a thermally-conductive but electrically-insulative filler between the filament 32 and the outer sheath 30. Heat from the filament 32 is conducted by the sealing material 34 to the outer sheath 30, and heat from the outer sheath is conducted to the support plate 20 to heat a substrate supported thereon. Any breakdown in the thermal path between the outer sheath 30 and the heating filament 32 of the heating element may result in the over-heating and burn-out of the heating filament 32. Such a breakdown may also prevent adequate heating of the susceptor and substrate. Any breakdown in the electrical insulative property of the sealing material 34 may result in a short-circuit between the filament 32 and the outer sheath 30.

The outer sheath 30 may be constructed of a thermally and electrically conductive material, such as a metal. Specifically, the outer sheath 30 may be stainless steel or incoloy. The filament 32 may be constructed from a nichrome wire, which is a composite of nickel and chromium. The sheath 30 may have an outer diameter D which may be about 0.220 to 0.314 inches.

In one embodiment, the sealing material 34 is composed of substantially pure diamond powder. The diamond powder may be an industrial grade diamond material, available from, for example, Beta Diamond Products, of Yorba Linda, Calif. The diamond powder may be composed of particles having an average particle size between about five and fifty microns. Most of the particles may have a particle size of about fifteen to thirty microns. Such a diamond powder has an expected thermal conductivity of several hundred watts per meter per degree Kelvin (watts/m·K°). In comparison, magnesium oxide has a thermal conductivity of two to five watts/m·K°. In addition, a diamond powder of this granularity has an expected electrical resistivity of about $10^{16}$ ohm-cm, which is about ten times higher than most ceramic materials. It is expected that a larger average particle size would increase the thermal and electrical conductivity of the diamond powder. Conversely, a smaller average particle size would decrease the thermal and electrical conductivity of the diamond powder. Thus, the particle size of the diamond powder may be selected to provide a thermal conductivity and an electrical resistivity higher than those of prior ceramic materials such as magnesium oxide or boron nitride. Finally, diamond powder is chemically inert, extremely hard, resistant to thermal shock, and does not sinter under high pressures and temperatures.

The high thermal conductivity of the diamond powder sealing material 34 permits the heat generated by the filament 32 to be efficiently transferred to the outer sheath 30 and thence to the support plate 20. Therefore, the filament 32 may be operated at a much lower temperature, as compared to a heating element using a ceramic sealing material, such as magnesium oxide, and still achieve the same temperature in the outer sheath 30. For example, in a heating element using diamond powder as the sealing material 34, to heat the outer sheath 30 to about 700° C., the filament 32 needs to be operated at about 750–775° C. In comparison, in a heating element of approximately the same size and configuration, using magnesium oxide sealing material, to heat the outer sheath to 700° C., the filament needs to be operated at about 1400–1500° C. Thus, the diamond powder permits the filament 32 to be operated at a much lower temperature. This reduces the thermal shock to the filament and the sealing material, while increasing the lifetime of the heating element.

The heating elements 24 and 26 with a diamond powder sealing material may be constructed according to conventional techniques. In brief, a filament is positioned in the center of an empty sheath. One end of the sheath is sealed, a sealing material is poured into the sheath, and the assembly is shaken to settle the sealing material. Then the other end of the sheath is sealed, and the assembly is drawn through a set of pressurized rollers to compact it. Finally, the heating element is bent into the desired shape.

In another embodiment, the sealing material is composed of a mixture of a diamond powder and a filler material. The filler is preferably a ceramic material such as magnesium oxide or boron nitride. The filler material may be less than half of the total weight of the sealing material. The filler material may be sintered during the assembly of the heating element.

Referring to FIGS. 3 and 4, the support plate 20, as noted, is attached to the stem 137 of the susceptor 135. The support plate 20 includes a top plate 40, a base plate 42, and a braised region 44 therebetween. Disposed in the support plate 20 between the top plate 40 and base plate 42 are the heating elements 24 and 26 (see also FIG. 2).

The stem 137 includes a hollow core and is configured to mate with the base plate 42 of the support plate 20. A vacuum tight joint 85 is made such that the inside of the hollow core is at ambient (atmospheric) pressure.

Four heating element tubes 50 (only one is visible in FIG. 4) are disposed within the hollow core of the stem 137. Each heating element tube includes a conductive lead wire 52 (again, only one is visible in FIG. 4) for attachment to an end of a filament of a heating element. In addition, the stem 137 holds two grounding wires 56 (see FIG. 5) for attachment to the outer sheath 30 of each heating element. The heating element tubes 50 are terminated at the end of the stem 137, and the lead wires 52 are connected to a heater controller 54 (see FIG. 5), which in turn powers the heating elements and monitors the temperature of the support plate.

Referring to FIG. 5, the two lead wires 52 for each heating element are connected to the heater controller 54 to run a current through the filament 32. In addition, the ground wire 56 is connected to a ground 58 to ground the sheath 30. The grounded outer sheath 30 prevents the current flowing through the filament 32 from disturbing any plasma in the substrate processing region.

Referring to FIGS. 3 and 5, the top plate 40 and the base plate 42 each include first and second semi-circular grooved regions or channels 60 and 62, respectively, to receive the heating elements 24 and 26. To assemble the support plate 20, the heating elements are placed into the channels 62 in the base plate 42. The ends of each filament 32 are connected to the conductive lead wires 52 by a cold junction located approximately at the line shown by reference numeral 28 (see FIG. 2). At this boundary, the filament 32 of each heating element is bonded to each lead wire 52 so that the center of the support plate 20 is not directly heated, and the outer sheath 30 of each heating element is bonded to one of the heating element tubes 50. A brazing material 44 is disposed on the base plate 42, and the top plate 40 is placed onto the base plate 42 so that the heating elements fit into the grooves 60 in the top plate 40. Finally, the assembly is braised to join the top and base plate portions. Alternatively, the brazing material 44 may be eliminated and the base and top plates may be joined by welding.

Returning to FIG. 2, in one embodiment, the support plate 20 is rectangular in shape, and has a width of about 26.26 inches and a length of about 32.26 inches. This allows for the processing of a glass substrate for flat panel displays up to 570 mm×720 mm in size. The heating elements 24 and 26 may be located about 1.5 in. (38.1 mm) from the upper surface 22 of the support plate 20. In this embodiment, the outer heating element 24 is run at approximately 0.66 in. from the outer edge of the base plate, while the inner heating element 26 is run at approximately 7.75 in. from the outer edge. This configuration provides for uniform heating of a substrate placed on the support plate 20.

In summary, a substrate support plate includes a heating element. The heating element uses diamond powder as a sealing material between the filament and the outer sheath.

While the present invention has been described with reference to a specific embodiment, the description is illustrative of the invention and is not to be construed as limiting. Various modifications may occur to those of ordinary skill in the art without departing from the true spirit and scope of the invention as defined by the appended claims.

What is claimed is:

1. A heating element comprising:

a heating filament;

a sheath surrounding the heating element; and a sealing material disposed between the sheath and the heating filament and comprising a diamond powder and magnesium oxide.

2. A heating element comprising:

a heating filament;

a sheath surrounding the heating element; and a sealing material disposed between the sheath and the heating filament and comprising a diamond powder and boron nitride.

3. A heating element comprising:

a heating filament;

a sheath surrounding the heating element; and a sealing material disposed between the sheath and the heating filament and comprising a diamond powder with a particle size of about five to fifty microns.

4. The heating element of claim 3 wherein the diamond powder has a particle size greater than fifteen and less than about thirty microns.

5. A substrate support structure for use in a processing chamber, comprising:

a plate having a top surface for supporting a substrate; and a heating element associated with the plate, the heating element including a heating filament, a sheath surrounding the heating filament, and an electrically insulating sealing material including a diamond powder characterized by a particles size range of about 5 microns to about 50 microns and disposed between the sheath and the heating filament.

* * * * *